(12) United States Patent
Tiefenbacher et al.

(10) Patent No.: US 9,447,989 B2
(45) Date of Patent: Sep. 20, 2016

(54) CUSHION-SHAPED CONCENTRATOR INCLUDING A PLURALITY OF ABSORBERS DISPOSED IN A SINGLE CHAMBER WITH A GAS THEREIN AT OVERPRESSURE

(75) Inventors: Felix Tiefenbacher, Moedling (AT); Johannes Hoefler, Birsfelden (CH)

(73) Assignee: HELIOVIS AG, Wiener Neudorf (AT)

( * ) Notice: Subject to any disclaimer, the term of this patent is extended or adjusted under 35 U.S.C. 154(b) by 167 days.

(21) Appl. No.: 13/582,556

(22) PCT Filed: Mar. 2, 2011

(86) PCT No.: PCT/AT2011/000101
§ 371 (c)(1),
(2), (4) Date: Sep. 4, 2012

(87) PCT Pub. No.: WO2011/106811
PCT Pub. Date: Sep. 9, 2011

(65) Prior Publication Data
US 2012/0324888 A1   Dec. 27, 2012

(30) Foreign Application Priority Data
Mar. 5, 2010   (AT) ................... A 355/2010

(51) Int. Cl.
*F24J 2/12*   (2006.01)
*F24J 2/14*   (2006.01)
(Continued)

(52) U.S. Cl.
CPC ............ *F24J 2/125* (2013.01); *F24J 2/145* (2013.01); *F24J 2/5267* (2013.01); *F24J 2/5271* (2013.01);
(Continued)

(58) Field of Classification Search
CPC ...... F24J 2002/108; F24J 2/125; F24J 2/145; F24J 2/5267; F24J 2/5271; F24J 2/5406; F24J 2/5417; H01L 31/0525; Y02E 10/42; Y02E 10/45; Y02E 10/46; Y02E 10/47; Y02E 10/52

USPC ............ 60/641.15; 126/684, 696, 125, 625; 359/856
See application file for complete search history.

(56) References Cited

U.S. PATENT DOCUMENTS

| 4,438,760 A | 3/1984 | Radebold |
| 5,990,851 A | 11/1999 | Henderson et al. |

(Continued)

FOREIGN PATENT DOCUMENTS

| AT | 505 075 | 10/2008 |
| DE | 100 58 065 | 11/2001 |

(Continued)

OTHER PUBLICATIONS

English Machine Translation of FR2471564A1 (translated on Oct. 19, 2012).*

(Continued)

*Primary Examiner* — Jesse Bogue
*Assistant Examiner* — Paul Thiede
(74) *Attorney, Agent, or Firm* — Collard & Roe, P.C.

(57) ABSTRACT

A cushion-shaped concentrator for concentrating solar radiation in an absorber includes a transparent membrane that faces the incoming radiation and includes a reflector membrane which reflects the incident radiation in the direction of the absorber. The transparent membrane and the reflector membrane form an outer casing for a chamber filled with a gas at overpressure. Tension elements are arranged between the transparent membrane and the reflector membrane The tension elements produce constrictions on the reflector membrane that separate a plurality of distinct concavely curved sections of the reflector membrane.

19 Claims, 10 Drawing Sheets

(51) Int. Cl.
*F24J 2/52* (2006.01)
*F24J 2/54* (2006.01)
*H01L 31/054* (2014.01)
*F24J 2/10* (2006.01)

(52) U.S. Cl.
CPC ............. *F24J 2/5406* (2013.01); *F24J 2/5417* (2013.01); *H01L 31/0547* (2014.12); *F24J 2002/108* (2013.01); *Y02E 10/42* (2013.01); *Y02E 10/45* (2013.01); *Y02E 10/46* (2013.01); *Y02E 10/47* (2013.01); *Y02E 10/52* (2013.01)

(56) References Cited

U.S. PATENT DOCUMENTS

| | | | |
|---|---|---|---|
| 8,887,654 B2* | 11/2014 | Hoefler | 114/264 |
| 2004/0027310 A1 | 2/2004 | Braun | |
| 2009/0223508 A1 | 9/2009 | Hinderling | |
| 2009/0260620 A1 | 10/2009 | Winger et al. | |
| 2009/0272375 A1* | 11/2009 | Pedretti | 126/696 |
| 2010/0101562 A1* | 4/2010 | Pellegrino | F24J 2/0433 126/625 |
| 2010/0186733 A1 | 7/2010 | Hoefler | |
| 2011/0114083 A1 | 5/2011 | Pedretti | |

FOREIGN PATENT DOCUMENTS

| | | |
|---|---|---|
| DE | 20 2007 000 702 | 8/2007 |
| DE | 10 2008 020 851 | 10/2009 |
| EP | 0 050 697 | 5/1982 |
| FR | 2471564 A1 * | 6/1981 |
| GB | 1 602 434 | 4/1978 |
| WO | WO 2008/037108 | 4/2008 |
| WO | 2008/119094 A2 | 10/2008 |
| WO | WO 2009/117840 | 10/2009 |
| WO | WO 2010/017594 | 2/2010 |

OTHER PUBLICATIONS

International Search Report of PCT/AT2011/000101, date of mailing Jan. 16, 2012.
International Preliminary Report on Patentability of PCT/AT2011/000101, dated Sep. 25, 2012.
Austrian Patent Office Search Report A 355/2010 dated Sep. 6, 2010, with English translation of relevant parts.
Chinese Office Action in 201180012365.0, Issue Date Feb. 8, 2014.

* cited by examiner

CUSHION-SHAPED CONCENTRATOR INCLUDING A PLURALITY OF ABSORBERS DISPOSED IN A SINGLE CHAMBER WITH A GAS THEREIN AT OVERPRESSURE

CROSS REFERENCE TO RELATED APPLICATIONS

This application is the National Stage of PCT/AT2011/000101 filed on Mar. 2, 2011, which claims priority under 35 U.S.C. §119 of Austrian Application No. A 355/2010 filed on Mar. 5, 2010, the disclosure of which is incorporated by reference. The international application under PCT article 21(2) was not published in English.

BACKGROUND OF THE INVENTION

1. Field of the Invention

The invention relates to a cushion-shaped concentrator for concentrating electromagnetic radiation, in particular solar radiation, in an absorber, comprising a transparent membrane that faces the incoming radiation during operation and a reflector membrane that reflects the incident radiation in the direction of the absorber.

2. The Prior Art

AT 505 075 B1 discloses an inflatable solar collector composed of at least two chambers that are separated by a unilaterally reflective reflector membrane and that are adapted to be impacted with a gas independently of each other. An elongate absorber is arranged above the reflector membrane in the region of the skin surface of the tubular casing. The curvature of the reflector membrane required for reflecting the incident solar radiation in the absorber is achieved in that the two chambers are each charged with different pressures. This solar collector basically operates perfectly and is, for instance, suited for smaller terrestrial solar plants.

US 2004/027310 A1 describes a ball-shaped casing for concentrating solar radiation. The ball-shaped casing is divided by a mirror into two substantially hemispherical chambers between which a pressure difference is maintained.

Accordingly, this prior art requires at least an outer casing and a reflector membrane or a mirror, respectively, arranged in the interior of the casing, which necessitates complex manufacturing. Moreover, this arrangement causes a poor land use since the concentrators have to be positioned with a considerable distance to each other so as to minimize the mutual shadowing in the morning and in the evening.

DE 10 2008 020 851 A1 discloses, on the one hand, an inflatable cushion assuming a paraboloidal shape in the inflated condition. The incoming radiation is coupled, by a reflector membrane via a coupling mirror, into a light-conducting stay tube guiding the radiation energy via a light conductor to an absorber. Accordingly, the absorber is here arranged outside of the cushion. Additionally, a film-parabolic-trough-module is described which is formed as a "rondel" and has a cover construction. This cover construction comprises a cover at which a parabolic trough arrangement with a mirror film is suspended which concentrates the incoming solar radiation on absorber tubes. Moreover, an arrangement of rods is provided which serves to stabilize the transparent cover. The suspension of the film, however, depends on gravity, so that a change of position would have an effect on the shape of the film. Accordingly, this design is not suited for a flexibly relocatable arrangement.

EP 0 050 697 A1 discloses a concentrator in the shape of an aerodynamic wing comprising a transparent film and a support structure enclosed by a skin. The upper side of the support structure is covered with a reflective film forming along with the transparent film a cushion that is filled with gas at overpressure, so that the film is convexly curved. The incoming radiation is concentrated in an absorber system that is arranged outside of the cushion. In addition, a network is provided that transfers part of the forces to the support structure, so that it is possible to make the film thin. The quasi homogeneous support structure that may be manufactured of rigid foam or a similar material may be replaced by a support framework of struts and ribs. Thus, a complex support structure or an appropriate support framework arranged outside of the cushion is required to achieve the desired shape of the concentrator.

U.S. Pat. No. 5,990,851 discloses a different antenna structure conceived to be used in space, comprising a reflector surface that is supported by a carrying structure in the form of a tube having the shape of a circular ring. The antenna structure further comprises a tension structure formed by a collapsible network of vertical connecting elements extending diagonally or in circumferential direction (belts, bands, etc.). The reflector film is fastened to vertical connecting elements such that a focusing (parabolic) surface is formed.

GB 1 602 434 discloses a solar collector with a reflector and a transparent cover portion. For stabilization of the arrangement, a framework structure applied outside is provided which carries an arm with an absorber fastened thereto.

DE 20 2007 000 702 U1 describes a tracking system for a photovoltaic power plant mounted on a floating island.

DE 100 58 065 A1 discloses an inflatable reflector, for instance, for a parabolic antenna, comprising a plurality of inflatable chambers that are arranged at a joint support wall coated with an electromagnetically and/or optically reflective layer. The support wall may be fastened with a fastening network of ropes or the like.

SUMMARY OF THE INVENTION

In contrast to this, the object of the present invention consists in providing a simply designed, low-cost cushion-shaped concentrator of the initially mentioned kind by means of which electromagnetic radiation, in particular solar radiation, can be concentrated at high efficiency in an absorber.

This is achieved with the cushion-shaped concentrator of the initially-mentioned kind in that the transparent membrane and the reflector membrane form an outer casing for a chamber filled with a gas at overpressure, wherein tension elements are arranged between the transparent membrane and the reflector membrane, said tension elements producing constrictions on the reflector membrane that separate concavely curved sections of the reflector membrane.

In the concentrator according to the invention, the reflector membrane is part of the outer casing that encloses the gas-filled chamber in its interior. The electromagnetic radiation enters through the transparent membrane oriented in the direction of the radiation source, is reflected at the reflector membrane (for instance, a reflective membrane), and is concentrated in the absorber and converted energetically there. Tubes through which a medium flows, photovoltaic elements, etc. may serve as an absorber.

Due to the pressure gradient between the pressurized chamber and the outer face, an outwardly directed force acts on the transparent membrane or the opposite reflector membrane, respectively. The tension elements counteract the prevailing overpressure in their tensioned condition. This way, it is possible to specifically adjust the desired geometry of the cushion-shaped concentrator by means of the tension elements. The transparent membrane and the reflector membrane jointly form an outer casing of the concentrator, so that a separate arrangement of the reflector membrane in the interior of the casing is not required. Accordingly, a particularly material-saving and hence cost-saving design is achieved. Since the reflector membrane and the transparent membrane are indirectly and/or directly tensioned with one another via the tension elements arranged in the interior of the enclosed chamber, a stable arrangement may in particular also be achieved in the case of a large-area design of the concentrator cushion.

With respect to an efficient concentration of the incoming radiation in the absorber, the tension elements produce constrictions on the reflector membrane which separate concavely curved sections of the reflector membrane. The pressurized gas in the interior of the concentrator causes the reflector membrane or the transparent membrane, respectively, to be curved concavely or inwardly between the contact points of the tension elements at the respective membrane, viewed from the direction of the incoming beams. By means of the arrangement of the constrictions of the reflector membrane which are formed by the contact points of the tension elements it is possible to produce curved sections of the reflector membrane which allow an expedient and efficient concentration of the incoming radiation as a function of the geometry of the absorber.

With respect to a material-saving, low-cost design it is of advantage if a longitudinal element, in particular a longitudinal element that is deformable transversely to its longitudinal extension, preferably a rope, or a rigid longitudinal element, preferably a rod, which is tensioned under tensile load is provided as a tension element. Accordingly, the tension element is tight under tension once a certain minimal pressure exists in the enclosed chamber of the concentrator. The longitudinal element is fastened to substantially point-shaped or small-area contact points at the transparent membrane or the reflector membrane, respectively, so that substantially point-shaped or small-area constrictions are formed. If a deformable rope or the like is used as a longitudinal element, a particularly space-saving arrangement of the concentrator may be achieved before it is put into operation. On the other hand, rigid longitudinal elements such as rods or the like may be used which enable a tensioning of the casing irrespective of the gas pressure.

In particular in the case of a large-area design of the cushion-shaped concentrator it is favorable if the transparent membrane or the reflector membrane, respectively, is supported on at least one rigid longitudinal support. The longitudinal support extends in a plane arranged substantially in parallel to the main extension plane of the concentrator. Preferably, a plurality of rigid longitudinal supports that are in particular arranged in parallel to each other are connected with the transparent membrane or the reflector membrane, respectively.

In a preferred embodiment it is provided that two or more tension elements are each fastened at a joint fastening region in particular of the rigid longitudinal support. Accordingly, the end regions of two tension elements each engage in the same fastening region.

A division of the casing into preferably identical sections may be achieved if the tension elements are arranged to be angled in the kind of a framework in a longitudinal direction of the casing. Such a "zig-zag tensioning" as it is known in another context from architecture enables an optimal utilization of space and a particularly stable, regular tensioning of the casing with a simultaneous low shadowing of the mirror surface. Other particularly advantageous shapes of the reflector membrane such as those of parallel troughs and of dishes arranged in the shape of a checkerboard or a honeycomb can be achieved by an appropriate choice of the fastening regions for the tension elements, in particular in combination with longitudinal supports that are rigid toward deflection or flexible, respectively.

In order to be able to specifically adapt the cushion-shaped concentrator to changing conditions, for instance, to the temporal variation of the position of the sun, it is favorable, for achieving a uniaxial tracking, if the casing is mounted to be rotated about an axis of rotation extending perpendicular to its main extension plane. The rotatable arrangement of the concentrator may be performed in the case of a terrestrial arrangement by mounting rollers, for example.

It is frequently moreover favorable if the casing is, in particular by a local change of a buoyancy force acting on the casing, mounted to be rotated about an axis of rotation extending in the main extension plane of the casing. Accordingly, the casing is adapted to be tilted, which enables a tracking with respect to the position of the sun about a further axis if the concentrator is designed as a sun collector. The buoyancy force acting on the casing may be influenced in various manners. For instance, a pressure gradient may be established between separate, in particular asymmetrically arranged chambers of the concentrator.

An expedient tensioning of the enclosed chamber of the concentrator may be achieved if the tension elements are tensioned in particular radially (star-shaped) between a fastening body positioned centrally in the interior of the casing and the transparent membrane or the reflector membrane, respectively. The fastening body is preferably positioned centrally between the transparent membrane and the reflector membrane and is held in place by tension elements acting in opposite directions, in particular tensioned ropes. A particularly favorable position is every point on a central line between the connecting line of all reflector membrane ball central points or the reflector membrane cylinder axis central axis, on the one hand, and the connecting line of all the deepest points of the reflector membrane, on the other hand.

In order to be able to specifically influence the beam cross section of the radiation reflected by the reflector membrane, it is of advantage if a concavely curved section of the reflector membrane is shaped by a pattern of the reflector membrane or by the overpressure of the gas in the interior of the casing, respectively, such that the radiation reflected by the reflector membrane is concentrated at the absorber in a substantially linear or a substantially point-shaped area. The term "pattern" includes a suitable design of the reflector membrane, for instance, the composition of segments as it is known from footballs or water balls. Accordingly, the concave curvature of the reflector membrane may be adjusted in a particular section by the selection of a suitable pattern, on the one hand, in particular a locally different deflecting ability of the reflector membrane may also be provided. On the other hand, the radius of curvature of the curved section may be increased and/or decreased by increasing and/or decreasing the gas pressure. This is not the case with a bulging body made of inelastic membranes.

For instance, different material strengths of the reflector membrane or the integration of particular shaping elements at the intended places may result in a desired shape of the reflector membrane. The dimensions of the cushion-shaped concentrator may range from few meters up to several kilometers.

In a preferred, low-cost embodiment it is provided that at least one elongate line absorber is provided as an absorber, to which a respective concavely curved section of the reflector membrane with a curvature that is substantially constant in the longitudinal direction of the line absorber is assigned. Accordingly, in this embodiment the radiation reflected by the reflector membrane is concentrated in an elongate or substantially linear area that is covered as exactly as possible by the line absorber. A substantially cylindrically curved section of the reflector membrane faces the line absorber, by which the incoming radiation is concentrated along the longitudinal extension of the line absorber.

For fastening the line absorber in the interior of the casing it is of advantage if the line absorber is fastened to a longitudinal support that is connected with the transparent membrane. The line absorber is oriented in parallel to the main extension plane of the concentrator and is preferably positioned adjacent to the transparent membrane.

In order to increase the radiation output and/or the concentration factor achievable, it is of advantage if small-area point absorbers that are arranged at a distance to each other are provided as absorbers, wherein a section of the reflector membrane which is concavely curved in the kind of a rotation body, in particular a spherical cap or a paraboloid, is assigned to each point absorber. Accordingly, an elongate absorber surface, as it is utilized with a line absorber, is broken down into a plurality of point absorbers that are preferably arranged at a constant distance to each other. For achieving a point-shaped focusing of the reflected beam, the corresponding sections of the reflector membrane are each curved in the kind of a rotation body.

As described before, an at least uniaxial tracking of the cushion-shaped concentrator may be effected by swiveling the casing about an axis extending perpendicular or parallel, respectively, to the main extension plane of the concentrator. It is often favorable, however, if the absorber(s) is/are mounted to be displaced or swiveled about at least one axis of rotation by means of a drive device, in particular a self-locking reduction gear unit, a step motor, or a hydraulically or pneumatically operable linear drive. Accordingly, in addition or alternatively to the tracking of the concentrator by tilting and/or rotating of the casing, the absorber(s) is/are adapted to be permanently tracked with the drive device with respect to a focus movable in at least one axis relative to the concentrator surface, i.e. to be specifically displaced or swiveled, respectively.

A preferred embodiment provides that the absorber is adapted to be displaced or swiveled, respectively, by the drive means uniaxially along a path that is curved in particular in the shape of a circular arc, or biaxially in correspondence with a rotation body surface in particular. In many cases, in particular in the case of a solar collector, it is necessary that the orientation of the absorber can be modified in two axes. This may be performed by a biaxially displaceable and/or swivelable absorber. If the absorber is uniaxially displaceable or swivelable in a substantially one-dimensional path, the tracking about the second axis may be performed by swiveling or tilting the cushion-shaped concentrator. In the case of uniaxial tracking, the absorber is—in correspondence with the geometry of the curved section of the reflector membrane facing the absorber—guided on a path that is curved substantially in the shape of a circular arc. In the case of the biaxial tracking, the absorber is adapted to be displaced or swiveled in an area, in particular a rotation body surface. The path of a point absorber extends in particular on the surface of a ball and/or paraboloid surface.

For a displaceable or swivelable mounting of the absorber it is favorable if the absorber is mounted via a connecting element, in particular a swivelable connecting rod, at at least one stationary fastening body. The stationary fastening body is preferably the fastening body that is arranged in the middle between the transparent membrane and the reflector membrane, from which the tension elements are tensioned in particular radially (star-shaped) to the transparent membrane or the reflector membrane, respectively. Accordingly, the central fastening body may serve both as a central contact point for the tension elements and as a suspension for the absorber. When the connecting rod is swiveled relative to the fastening body, the absorber connected with the free end of the connecting rod describes a path that is substantially in the shape of a circular arc.

For a precise breaking down of the incoming beam concentration to the substantially point-shaped point absorbers it is of advantage if the point absorbers are, via a joint coupling, in particular a coupling rod or a rope, arranged to be immovable with respect to each other in their relative position, wherein the point absorbers are adapted to be displaced or swiveled synchronously with the drive device. Accordingly, the position of the point absorbers may be modified in one or two axes, respectively, while they are coupled to each other, wherein control means that is in communication with the drive device is preferably provided for controlling the tracking. The relative position of the point absorbers to each other is independent of the respective deflection of the connecting element, wherein each point absorber per se is adapted to be swiveled about its axis of rotation that is formed in particular by the end of the coupling rod fastened to the fastening body.

In order to maintain the function of the cushion-shaped concentrator at least partially even if the casing has a leakage, it is of advantage if the casing is divided into at least two chambers by at least one in particular transparent film, wherein this film is preferably designed as a tension element. Accordingly, a point-shaped leak in the casing merely causes the failure of the affected chamber, wherein the remaining chambers may perform their functions irrespective thereof. Accordingly, the film is to perform an airtight division of the chamber enclosed by the casing. Moreover, the film may be tensioned during operation so as to support and/or replace as a tension element the rope-like tension elements.

An advantageous division of the gas-filled chamber may be achieved if the casing is divided into elongate chambers by films that are arranged substantially in parallel to each other. Accordingly, the chamber is divided into a plurality of elongate chambers by the films arranged in parallel.

In this respect, it is particularly favorable if the elongate chambers are each divided by films extending transversely to their longitudinal extension. Thus, a substantially checkerboard-like arrangement of the individual chambers results in the concentrator. In an alternative embodiment a honeycomb-like division of the enclosed chamber is provided.

A preferred embodiment of the invention provides a solar power plant with the concentrator according to the invention, which is used on shore for gaining useful energy from solar radiation.

With respect to a utilization of the solar energy which is independent of the prevailing weather situation it is favorable if the concentrator is positioned above the clouds in the stratosphere. For this purpose, the chamber in the interior of the casing may be filled with a buoyant gas (e.g. a noble gas). The cushion may be designed to float free in the kind of a zeppelin, on the one hand.

In a preferred embodiment it is, however, provided that the casing filled with the buoyant gas is adapted to be anchored on the ground by at least one fastening element, preferably a rope.

For the orientation of the floating cushion at the radiation source it is favorable if the casing filled with the buoyant gas is mounted to be rotated about at least one axis of rotation extending in the main extension plane of the casing via fastening elements engaging the cushion at different positions.

In order to tilt or swivel the cushion-shaped concentrator it is favorable if the cushion comprises at least two chambers adapted to be filled with the buoyant gas independently of each other. Accordingly, it is possible to adjust a pressure gradient in the chambers which effects a different buoyancy force on the chambers and hence a swiveling of the concentrator. It is further favorable if at least one ballast chamber is provided at the back or at the edge of the cushion-shaped concentrator, whose variable filling with a liquid renders it possible that the center of gravity is shifted and hence the orientation is influenced specifically.

Apart from a terrestrial use in particular as a solar power plant and an embodiment as a floating cushion filled with a buoyant gas, the afore-described cushion-shaped concentrator may also be used in a floating platform. The floating platform comprises a flat cover element and a sealing element connected with the cover element, which makes a sealing contact with a liquid surface during operation and encloses a closed cavity together with the cover element and the liquid surface or a bottom surface, in which cavity an overpressure which supports the platform can be produced by a compressed-air production apparatus.

For the specific influencing of the buoyancy forces acting on the floating platform it is of advantage if the cover element or the sealing element, respectively, is connected with a floating body, in particular an elongate floating body projecting deeply into the liquid during operation, a floating body floating on the liquid surface during operation, or a floating body completely immersed in the liquid, wherein preferably a plurality of floating bodies are connected with each other particularly by means of struts or braces. The elongate floating bodies having a small cross section are particularly suited for water bodies with rough sea since they offer only little resistance to the movement of the waves. It is particularly favorable if these elongate floating bodies project in the kind of a spar buoy into a depth in which the wave energy has decreased substantially with respect to the water surface. The floating bodies positioned on the water surface are particularly suited for still waters and may be designed in the kind of conventional compact buoys. For an even distribution of the introduced wave energy the floating bodies may be tensioned or stranded among each other.

In a preferred embodiment of the floating platform it is provided that, in particular in the region of an axis of rotation extending perpendicularly to its main extension plane, components for an operation of the platform as a solar power plant are provided, in particular an inverter and/or a steam turbine. Accordingly, the platform may be used as a floating solar plant floating on a natural or an artificially built water body or a basin installation, respectively.

BRIEF DESCRIPTION OF THE DRAWINGS

The present invention will be explained in detail by means of the enclosed drawings which illustrate embodiments and application possibilities. There show.

DETAILED DESCRIPTION OF THE INVENTION

Figure 1A:
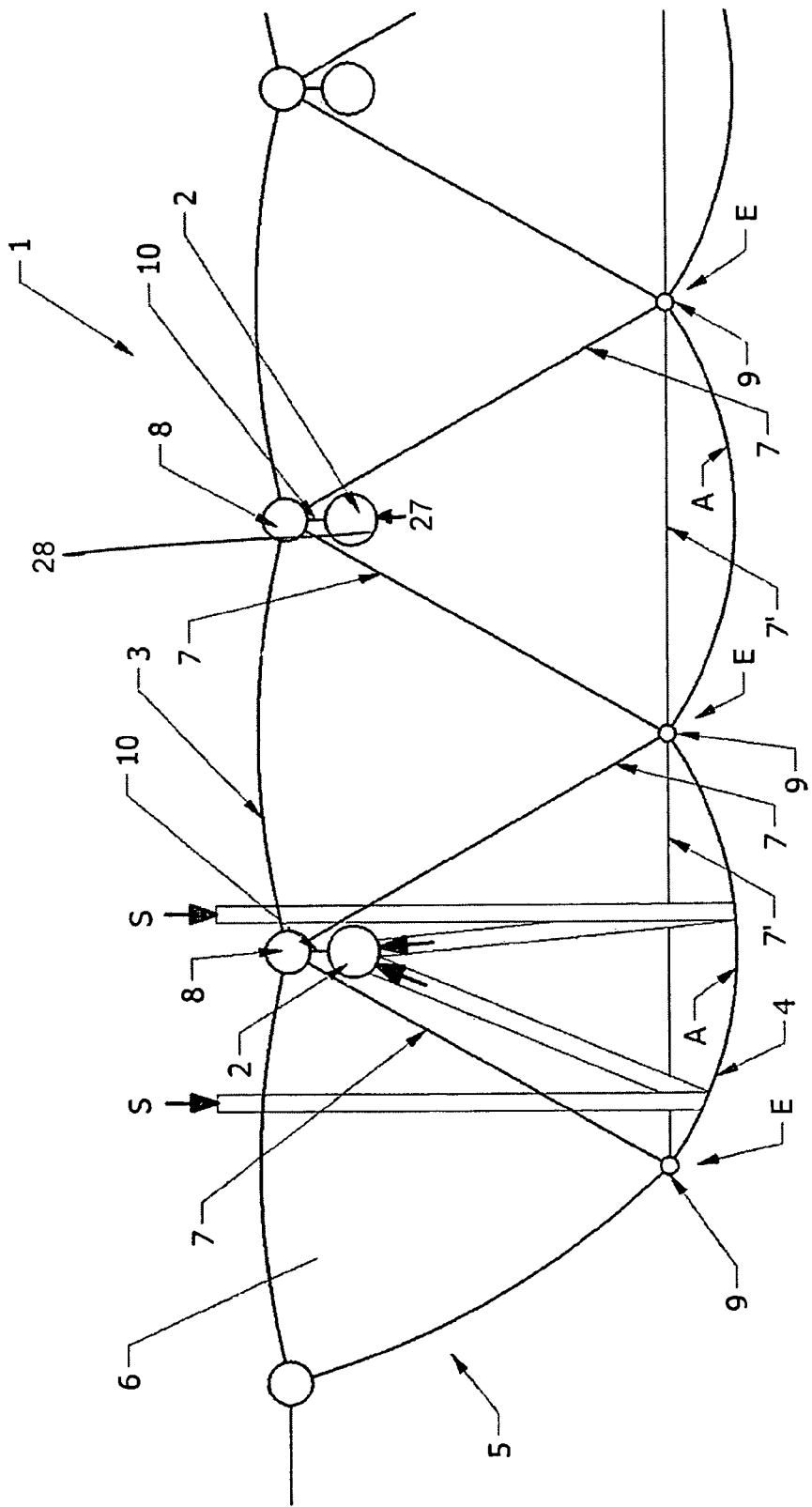
FIGS. 1a-1d different embodiments of cushion-shaped concentrators in cross section.

FIGS. 1a to 1d each illustrate schematically a part of a cushion-shaped concentrator 1 for concentrating electromagnetic radiation, in particular solar radiation, in cross section. The concentrator 1 serves in particular to concentrate sunbeams S in an absorber 2. In the absorber 2 the concentrated sunbeams S are appropriately converted energetically. Tubes through which a medium flows, photovoltaic elements, etc. may be used as the absorber 2. The sunbeams S pass through a transparent membrane 3 and are incident on a reflector membrane 4 from which they are reflected in the direction of the absorber 2. The transparent membrane 3 and the reflector membrane 4 are formed of a suitable, preferably stable, plastic material and plastic coating. The transparent membrane 3 and the reflector membrane 4 form an outer casing 5 for a chamber 6 filled with a gas at overpressure. The gas may be air or a buoyant gas buoying up the cushion-shaped concentrator 1 appropriately for applications in the air, for instance, a noble gas. It is also possible that a transparent liquid, for instance, is arranged at least partially in the chamber 6. Between the transparent membrane 3 and the reflector membrane 4 there are positioned tension elements 7 that counteract the overpressure in the chamber 6, so that at the fastening points of the tension elements 7 at the transparent membrane 3 and the reflector membrane 4 deformations thereof are formed. Thus, a desired shaping, in particular of the reflector membrane 4, with respect to the radiation to be concentrated, in particular the solar radiation S, may be effected and the concentration in the absorber 2 may be optimized. The connection between the transparent membrane 3 and the reflector membrane 4 for forming the outer casing 5 may be established by the transparent membrane 3 itself, the reflector membrane 4, or a specifically arranged membrane or the like. Ropes or rods of a suitable material are, for instance, possible as tension elements 7. When using ropes as tension elements 7, the cushion-shaped concentrator 1 can be transported in a particularly space-saving manner since the transparent membrane 3 and the reflector membrane 4 may be placed on top of each other. It is of advantage if the transparent membrane 3 and/or the reflector membrane 4 are supported on corresponding rigid longitudinal supports 8, 9. This gives the construction appropriate stability and enables the suitable fastening of the tension elements 7. The tension elements 7 produce corresponding constrictions E on the reflector membrane 4 and hence concavely curved sections A in the reflector membrane 4 in which the electromagnetic radiation, in particular the solar radiation S, is optimally reflected in the direction of the absorbers 2. In the embodiment pursuant to FIG. 1a the tension elements 7 are arranged between the transparent membrane 3 and the reflector membrane 4 in zig-zag shape. In the variants pursuant to FIGS. 1b and 1c, the tension elements 7 are arranged cross-wise between the transparent membrane 3 and the reflector membrane 4.

In addition, further tension elements 7' may be arranged between the longitudinal supports 9 to adjust the curvature of the reflector membrane 4. The gas volume being at overpressure in the chamber 6 of the outer casing 5 of the cushion-shaped concentrator 1 always strives for an overpressure as low as possible with respect to the environment and hence for a maximum volume. For adjusting the curvature of the reflector membrane 4 it is therefore possible to vary the relationship of the length of the tension elements 7' and the breadth of the reflector membrane 4 between two longitudinal supports 9 positioned next to each other. Such additional tension elements 7' may decrease the distance between two longitudinal supports 9 by tension and hence increase the curvature of the corresponding section A of the reflector membrane 4, or increase the distance between two longitudinal supports 9 by pressure and hence decrease the curvature of the corresponding section A.

In the embodiment pursuant to FIG. 1a, the absorbers 2 are fastened at the longitudinal supports 8 at the transparent membrane 3 via appropriate fastening elements 10. The absorbers 2 of this embodiment include an elongate line absorber 27 at which the radiation reflected by the reflector membrane 4 has been concentrated in a linear area 28 at the elongate line absorber 27. Theoretically, the absorbers 2 may also be integrated directly in the longitudinal supports 8 at the transparent membrane 3 (not illustrated).

Figure 1B:
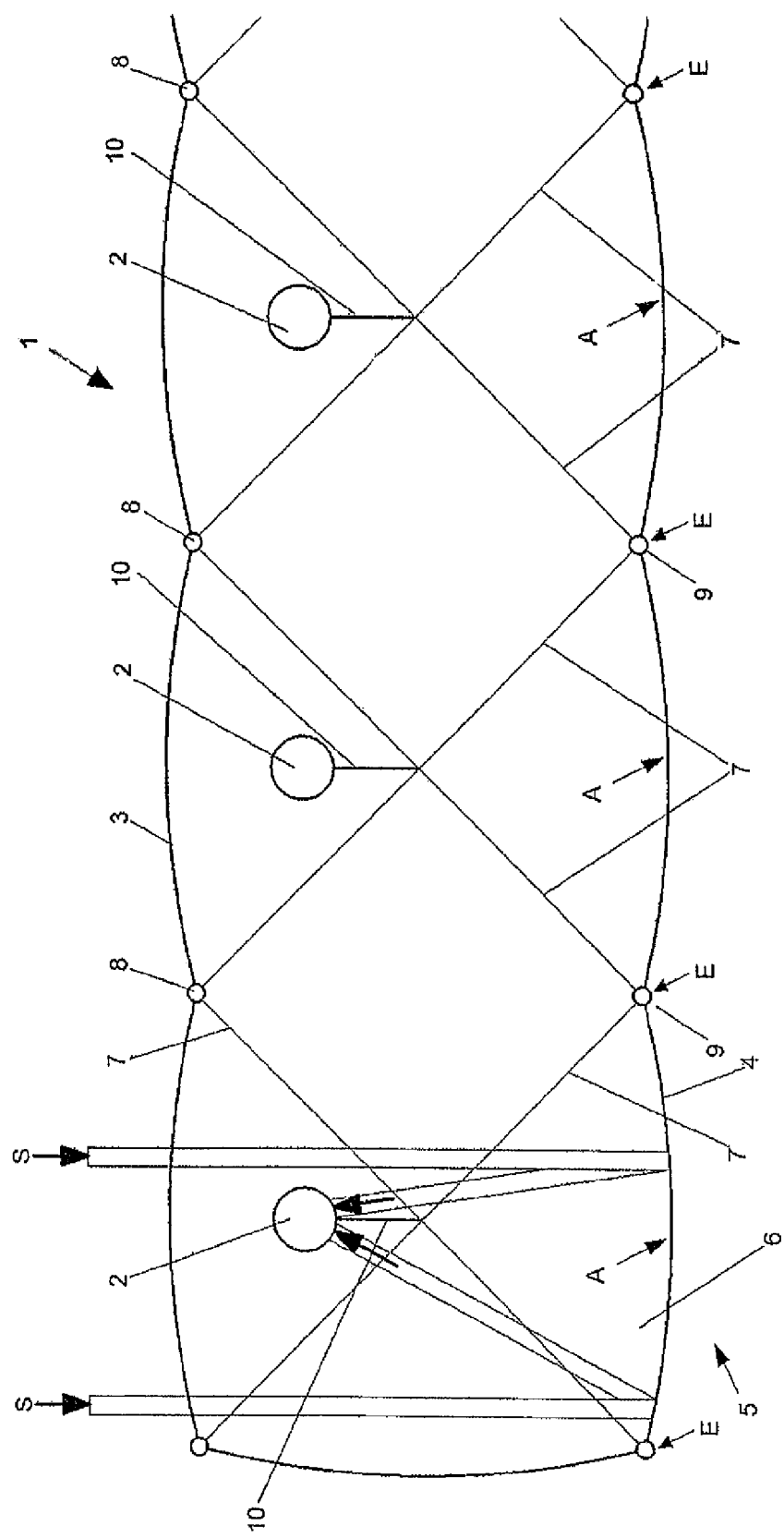

In the variant pursuant to FIG. 1b, the absorbers 2 are positioned at the point of intersection of the crosswise tension elements 7 via an appropriate fastening element 10, for instance, a rod.

Figure 1C:
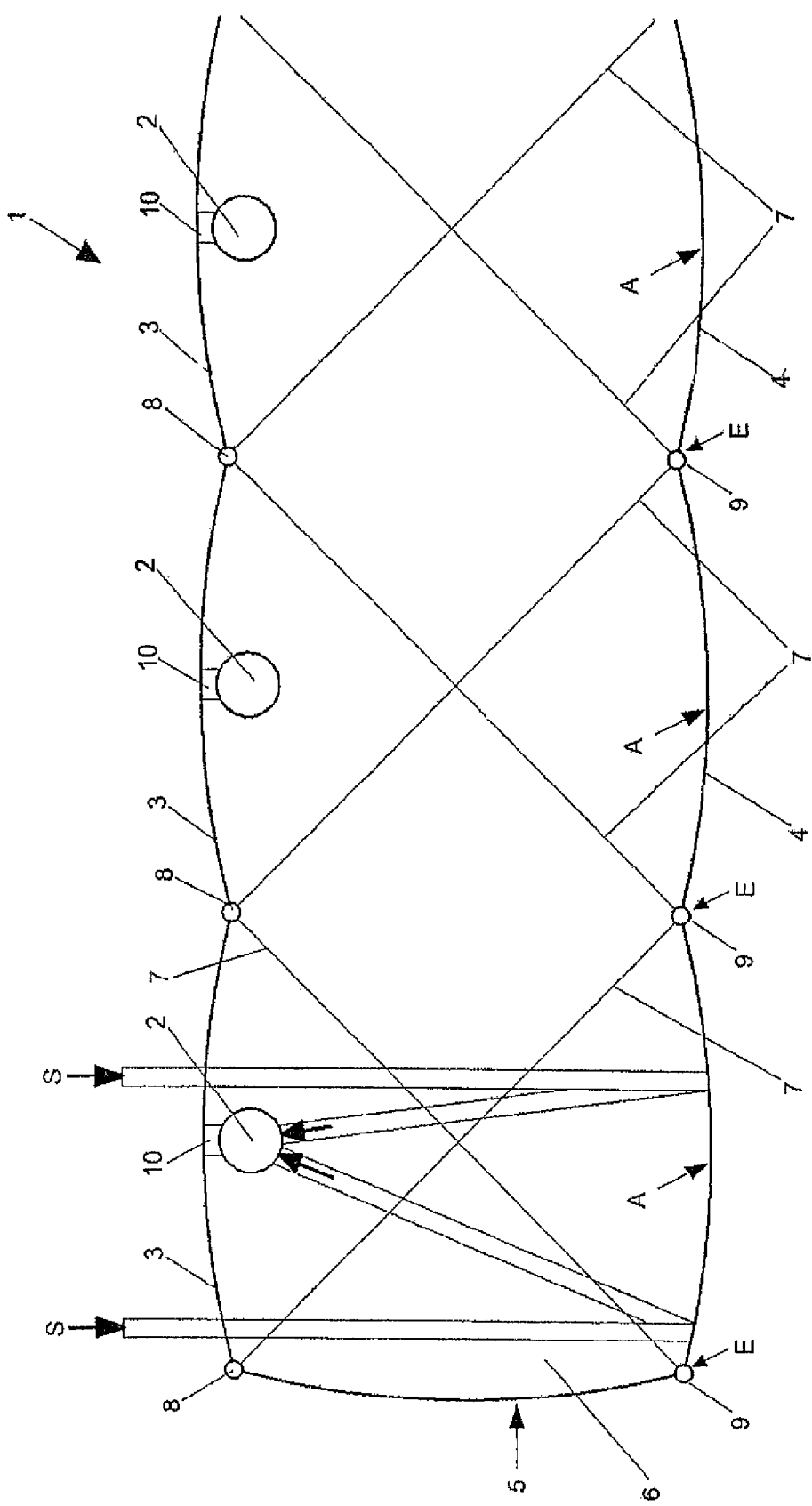

The embodiment pursuant to FIG. 1c differs from that of FIG. 1b in that the absorbers 2 are directly connected with the transparent membrane 3 via appropriate fastening elements 10. Instead of using specific fastening elements 10, the absorbers 2 may also be glued to the inner side of the transparent membrane 3.

Figure 1D:
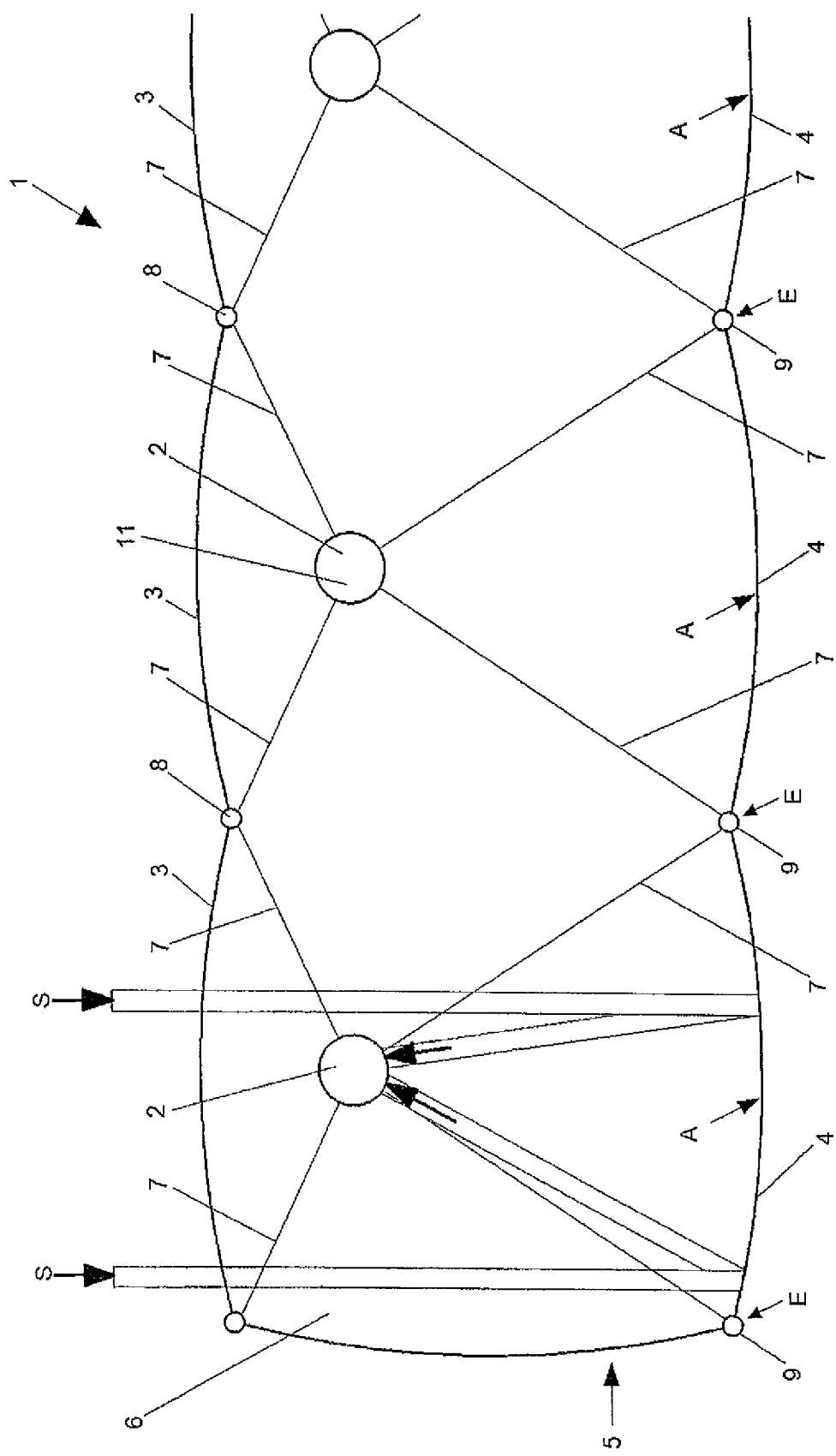

In the variant pursuant to FIG. 1d, the tension elements 7 are arranged between the transparent membrane 3 and the reflector membrane 4 by interposition of the absorbers 2. Thus, the absorbers 2 are arranged to quasi float free in the chamber 6. As a matter of course, an appropriate fastening body 11 on which the absorbers 2 are mounted may also be positioned between the tension elements 7. In the variants pursuant to FIGS. 1b, 1c, and 1d, at the transparent membrane the longitudinal supports 8 may be designed to be weaker as compared to the variant pursuant to FIG. 1a since the longitudinal supports 8 need not carry the absorbers 2.

Figure 2:
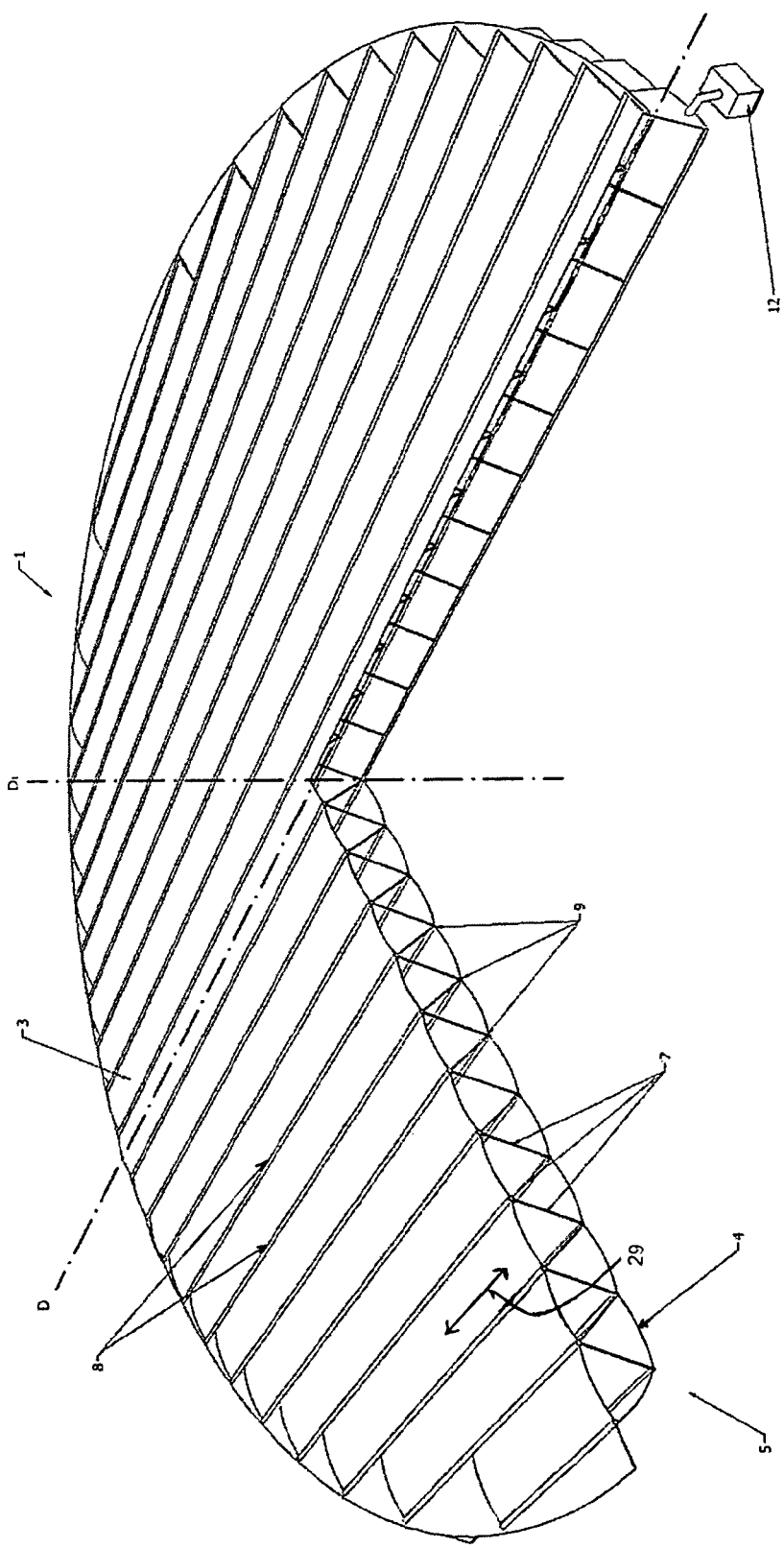
FIG. 2 a round cushion-shaped concentrator in a partially sectioned perspective view.

FIG. 2 illustrates a partially sectioned perspective view of a round cushion-shaped concentrator 1 in which the tension elements 7 are arranged between the transparent membrane 3 and the reflector membrane 4 in a longitudinal direction of the casing 5 to be angled in the kind of a framework. Such a cushion-shaped concentrator 1 may have a spatial extension of few meters up to several kilometers. Accordingly, the transparent membrane 3 and the reflector membrane 4 may, of course, also be designed in several parts to form the casing 5. A plurality of longitudinal supports 8 that are arranged in parallel to each other are arranged at the transparent membrane 3, and longitudinal supports 9 also extending in parallel are arranged at the reflector membrane 4. In order to enable a tracking of the cushion-shaped concentrator 1 in the direction of the radiation source, for instance, the sun, it is of advantage if the casing 5 is mounted to be rotated about an axis of rotation $D_1$ extending perpendicularly to its main extension plane. It may likewise be of advantage if the casing is mounted to be rotated about an axis of rotation $D_2$ extending in the main extension plane of the casing 5. The movement of the cushion-shaped concentrator 1 may be achieved by appropriate drives (not illustrated) or by the relocation of buoyant gases arranged in the casing 5. A compressed-air production apparatus 12 such as a pump and used for maintaining the overpressure in the casing 5 is illustrated schematically. In this embodiment, the absorber 2 is preferably an elongate line absorber to which a respective curved section A of the reflector membrane 4 with a curvature that is substantially constant in the direction of longitudinal extension 29 of the absorber 2 is assigned. The absorber 2 may be fastened to the longitudinal support 8 that is connected with the transparent membrane 3, as was explained in detail in FIG. 1a. Another particularly favorable method of decreasing the curvature is the modification of the pre-tension of the entire cushion-shaped concentrator 1 along one or both main extension axes. In the case of a floating platform this may, for instance, be performed by an increased use of measures that cause forces that are directed radially outwardly.

Figure 3A:
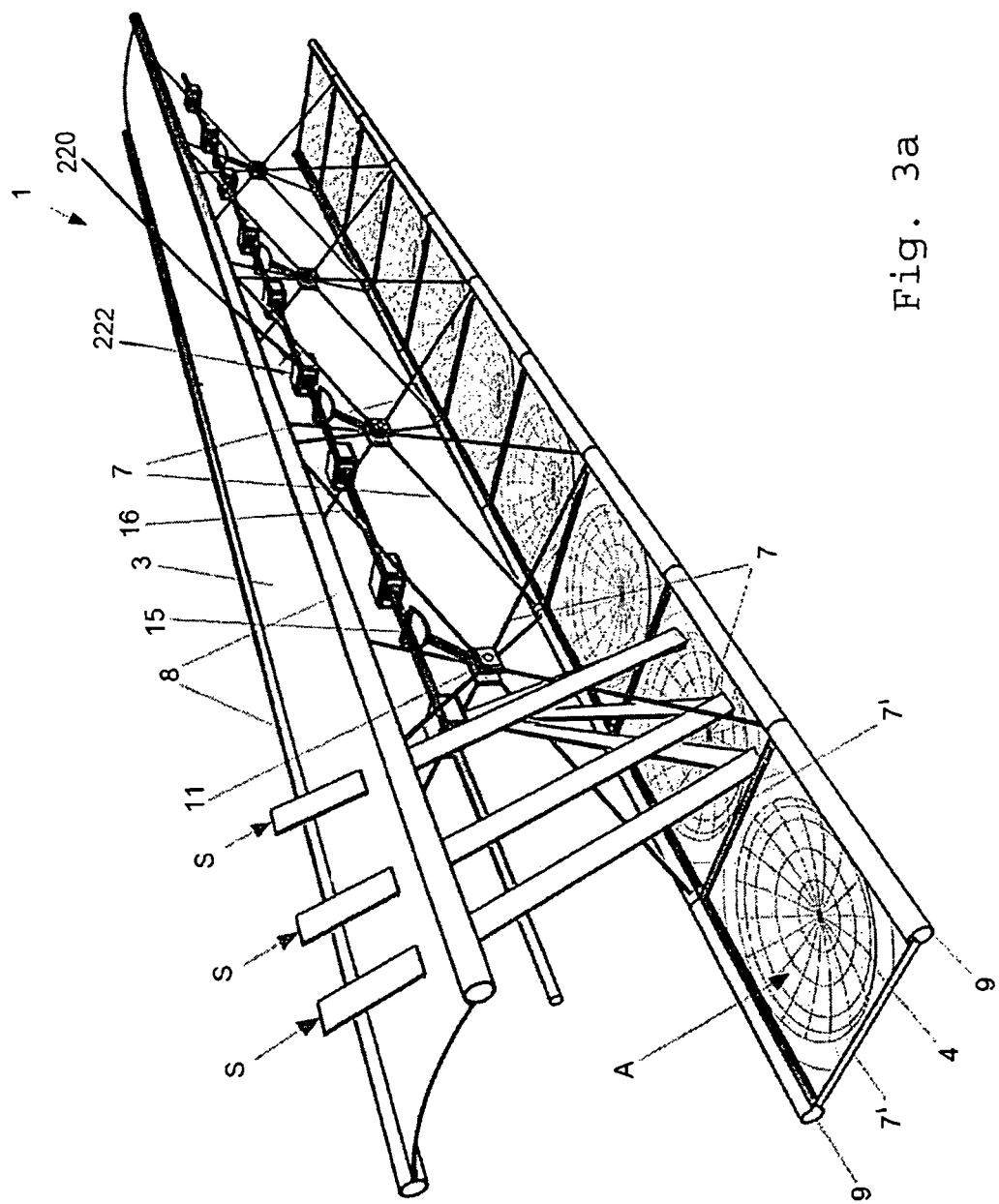
FIGS. 3a and 3b a further embodiment of a cushion-shaped concentrator with movable absorbers.
Figure 3B:
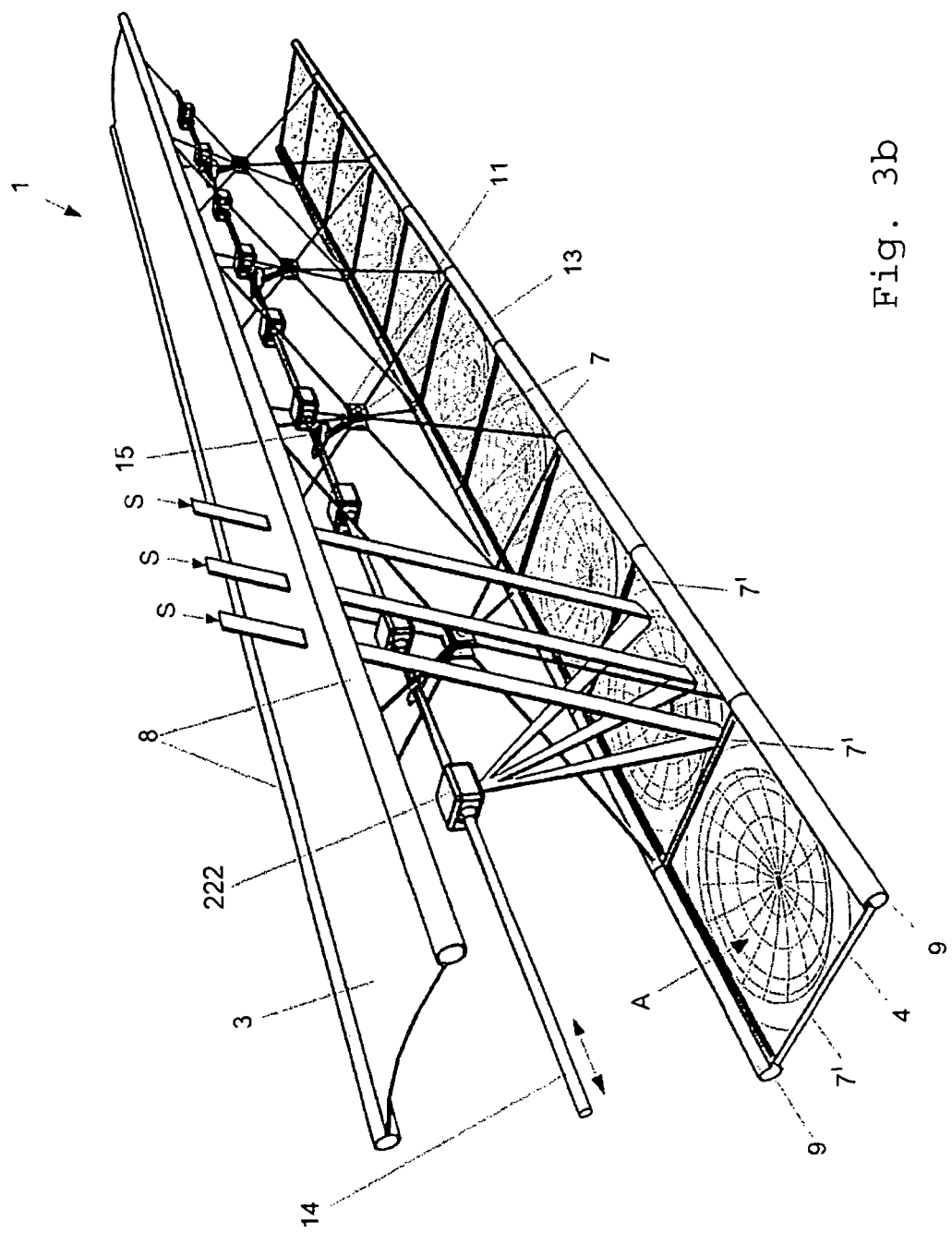

FIGS. 3a and 3b illustrate a further embodiment of a cushion-shaped concentrator 1, wherein concavely curved sections A are formed in the reflector membrane 4 by an appropriate arrangement of the tension elements 7, said sections having the shape of a spherical cap or of a rotating paraboloid. Thus, the incoming beams, in particular sunbeams S, are reflected substantially on a small point and concentrated, so that a small-area point-shaped absorber 222 may be used. The radiation reflected by the reflector membrane 4 is concentrated in a point-shaped area 220 at the point-shaped absorber 222. In addition to the tension elements 7 between the transparent membrane 3 and the reflector membrane 4 which are, for instance, formed by ropes or rods, further tension elements 7' may also be arranged for determining the concavely curved sections A in the reflector membrane 4. While flat, two-dimensional, inelastic membranes can only be curved one-dimensionally without crinkles by a pressure gradient, it is favorable for such two-dimensional curvatures of the reflector membrane 4 and for the optimal approaching to the desired shape of the section A if the reflector membrane 4 is composed of segments. This is, for instance, known with footballs (pentagons and hexagons) or water balls (resolution of the ball shape in the plane resembles a map of the earth). By such sections A that are curved concavely in two dimensions in the reflector membrane 4, a particularly high concentration of the radiation, in particular the solar radiation S, is achieved in the absorber 222. If the cushion-shaped concentrator 1 is not moved to follow the radiation source, in particular the sun, it is possible to take influence on modifications of the direction of the radiation source, in particular the sun, by a modification of the position of the absorber 222.

FIGS. 3a and 3b illustrate a corresponding embodiment of a cushion-shaped concentrator 1 with different solar radiation and an appropriately adapted position of the absorbers 222. For this purpose, the absorbers 222 are coupled with a drive device 13, so that their position can be changed. For this purpose, the absorbers 222 are connected with a coupling element 14, in particular a coupling rod, and are rotatably connected via a swivelable connecting rod 15 with a drive device 13 arranged in the fastening body 11. This way it is possible to achieve an optimum exploitation of the radiation, in particular the solar radiation S, even if the direction of the solar radiation S changes. The adjustment of the absorbers 222 is preferably performed automatically by the arrangement of appropriate detectors detecting the position of the radiation source, in particular the sun, and transmitting signals to the drive devices 13 (not illustrated) via appropriate control means.

Figure 4:
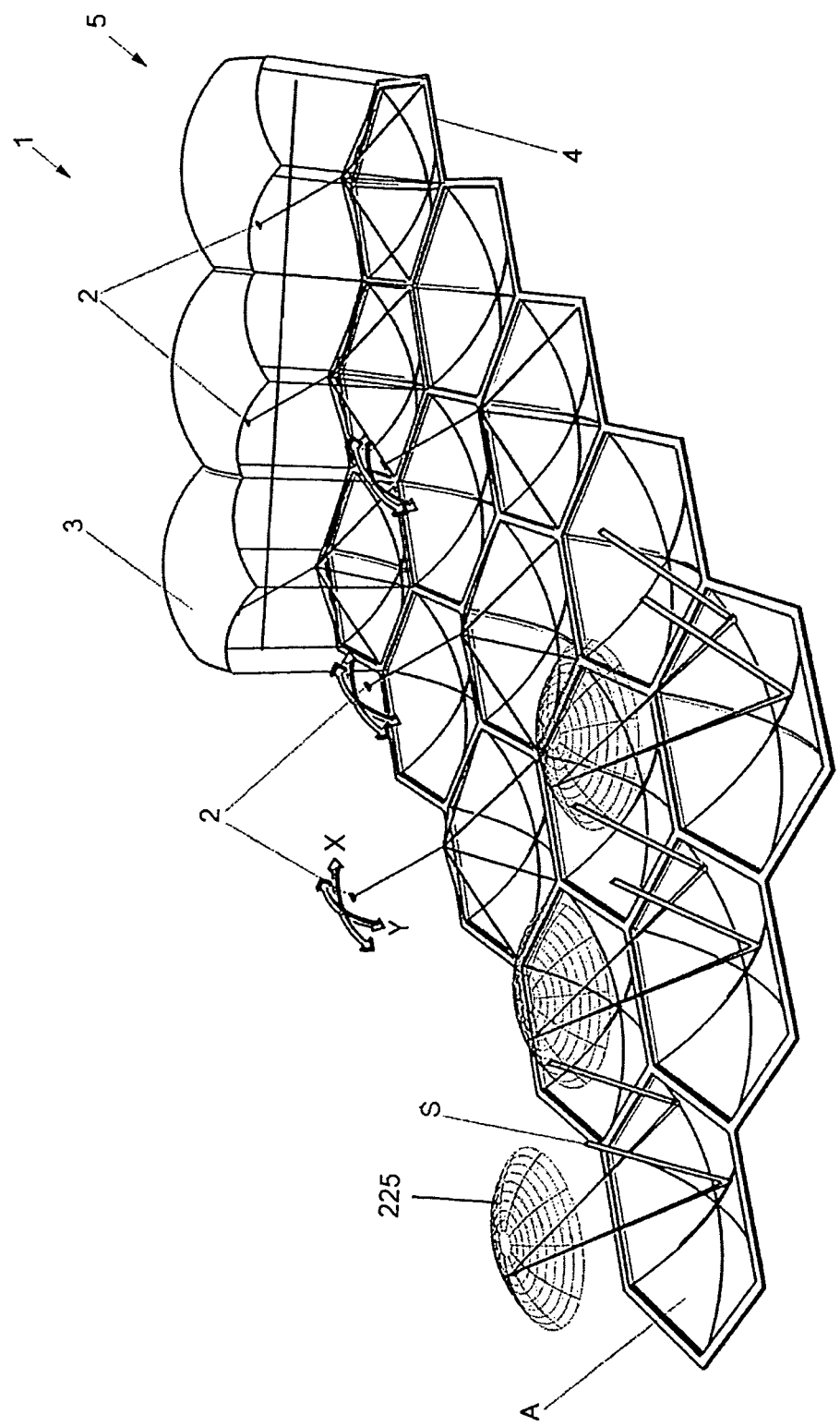
FIG. 4 a further embodiment of a cushion-shaped concentrator.

FIG. 4 illustrates a further embodiment of a part of a cushion-shaped concentrator 1, wherein the reflector membrane 4 is divided into concavely curved honeycomb-shaped sections A by an appropriate arrangement of the tension elements 7. When using the cushion-shaped concentrator 1 for concentrating solar radiation S, the sunbeams reflected at the concavely curved sections A of the reflector membrane 4 would make a movement along a spherical cap-shaped or a paraboloid-shaped area. For an appropriate tracking of the absorbers 2, they would have to be arranged to be displaceable or swivelable along two axes, as is illustrated by the arrows X, Y, in correspondence with a rotation body surface 225. In the case of a biaxial tracking of the absorber 2 the cushion-shaped concentrator 1 may be fixedly tensioned to the ground to be stationary, for instance, on inland water or on a static air cushion floating due to buoyant gas, or be mounted as a roof of a building and/or a sun shade, for instance, at parking lots close to the end consumers without having to be rotated or inclined. In the case of a stationary anchored cushion-shaped concentrator 1 it is also advantageous to use the anchoring thereof for the pre-tensioning of the casing 5, so that it is possible to reduce and/or flatten the curvature in a cost-efficient manner.

Figure 5:
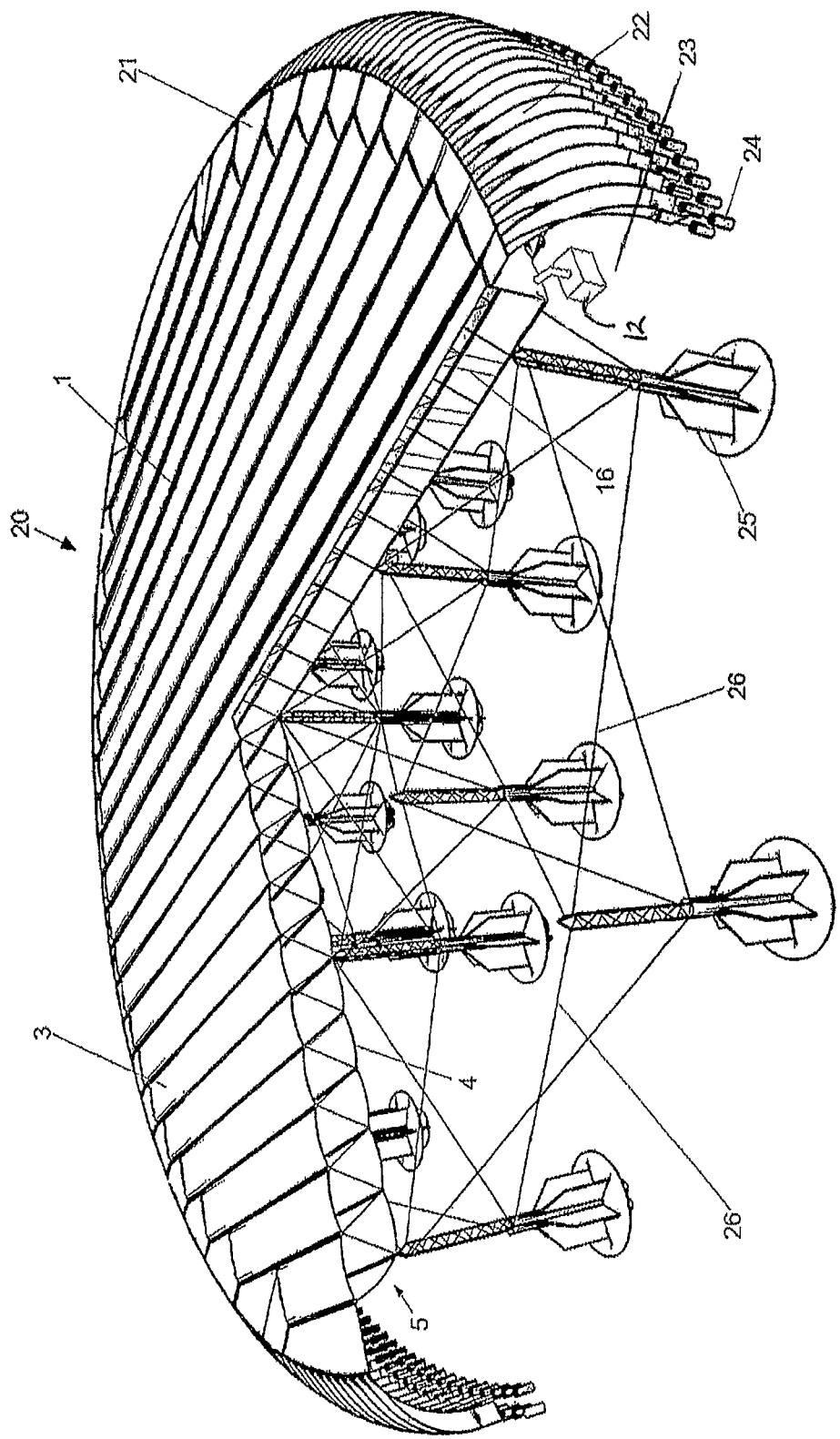
FIG. 5 a perspective view of a floating platform with a cushion-shaped concentrator according to the invention for use as a solar power plant.

FIG. 5 finally illustrates the use of a cushion-shaped concentrator 1 in circular shape which is arranged on a floating platform 20. Thus, it is, for instance, possible to build a solar power plant on the sea. In particular in the case of large extensions of the cushion-shaped concentrator 1 it is of advantage if the casing 5 is divided into at least two chambers by at least one in particular transparent film 16. This film 16 is also designed as a tension element 7 and produces the corresponding constrictions on the reflector membrane 4 and hence the desired curvature. The floating platform 20 comprises a flat cover element 21 and a sealing element 22 connected thereto which makes a sealing contact with a liquid surface during operation and encloses a closed cavity 23 together with the cover element 21 and the liquid surface or a bottom surface of the cover element 21. In the cavity 23, an overpressure which supports the platform 20 can be produced by a compressed-air production apparatus (not illustrated). Via appropriate floating bodies 24 it is possible to keep the sealing element 22 that is preferably formed by a film in the desired orientation. Drift anchors 25 may give the platform 20 appropriate stability. In addition, appropriate struts 26 or braces may provide appropriate stability.

Figure 6:
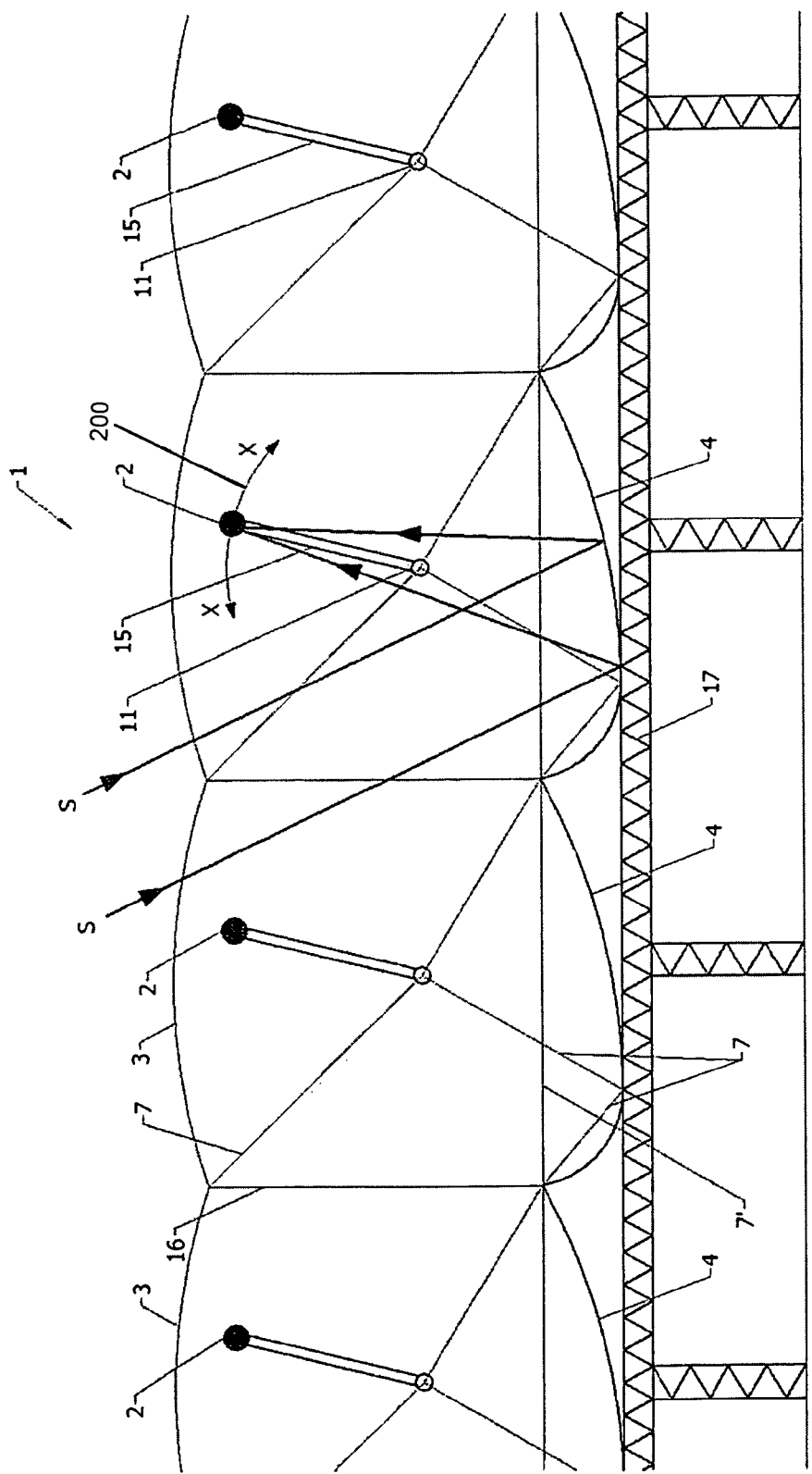
FIG. 6 a further embodiment of a stationary cushion-shaped concentrator with a one-dimensionally curved reflector membrane in cross section.

FIG. 6 illustrates a further embodiment of a stationary cushion-shaped concentrator 1 with a one-dimensionally curved reflector membrane 4 in cross section. In the case of such a stationary arrangement of the cushion-shaped concentrator 1 it is, for instance, arranged on an appropriate frame 17 or floating on a water body, respectively. In the case of a one-dimensional curvature of the reflector membrane 4 the sunbeams S are concentrated in a substantially linear absorber 2. In order to adapt the absorber 2 to the radiation source, in particular the position of the sun, the absorber 2 may be moved in an axis, as illustrated by the arrows X, uniaxially along a path 200 that is curved in the shape of a circular arc. In the case of such tracked absorbers 2 it is favorable if the distance between the transparent membrane 3 and the reflector membrane 4 is larger than the radius of curvature of the reflector membrane 4 since it is then possible to position the absorber 2 in a manner sheltered from the wind inside the cushion-shaped concentrator 1 and to use the tension elements 7 also as support points for the tracking of the absorbers 2.

A particularly favorable embodiment of a cushion-shaped concentrator 1 provides the inclination of every second row towards the radiation source, in particular the sun, by varying the relationship of the lengths of the tension elements 7' and the breadths of the reflector membrane 4 between two adjacent longitudinal supports 9. This makes it possible to achieve higher concentration factors during the tracking of the absorbers 2. An increase in concentration is also achieved by the illustrated asymmetrical curvature of the reflector membrane 4.

Such a stationary cushion-shaped concentrator 1 may, for instance, be used for a low-cost shadowing of parking lots in the direct vicinity of end consumers.

What is claimed is:

1. A cushion-shaped concentrator for concentrating solar radiation in a plurality of absorbers, the cushion-shaped concentrator comprising:
   the plurality of absorbers, wherein the plurality of absorbers comprises a plurality of photovoltaic elements or a plurality of tubes flown through by a medium,
   a transparent membrane configured to face incoming solar radiation, wherein the plurality of absorbers is positioned adjacent to the transparent membrane,
   a reflector membrane which reflects the incident radiation in the direction of the plurality of absorbers,
   tension elements arranged between the transparent membrane and the reflector membrane, and
   constrictions on the reflector membrane produced by the tension elements, respectively,
   wherein the transparent membrane and the reflector membrane form an outer casing for a chamber filled with a gas at overpressure and the plurality of absorbers are arranged inside the chamber filled with the gas at overpressure,
   wherein said tension elements counteract the overpressure in the chamber,
   wherein said constrictions on the reflector membrane separate a plurality of distinct concavely curved sections of the reflector membrane from each other, and
   wherein one of the plurality of absorbers is provided for each of the distinct concavely curved sections of the reflector membrane.

2. The cushion-shaped concentrator according to claim 1, wherein each tension element of said tension elements has a length extending in a first direction and
   is deformable transversely to the direction or
   is rigid and tensioned under tensile load.

3. The cushion-shaped concentrator according to the claim 1, wherein the transparent membrane or the reflector membrane is supported on at least one rigid longitudinal support.

4. The cushion-shaped concentrator according to claim 3, wherein a first tension element of the tension elements is fastened at a first fastening region of the longitudinal support, and
   wherein a second tension element of the tension elements is fastened at the first fastening region of the rigid longitudinal support.

5. The cushion-shaped concentrator according to claim 4, wherein the first and second tension elements are angled with respect to the rigid longitudinal support.

6. The cushion-shaped concentrator according to claim 1, wherein the casing is mounted to allow rotation of the casing about a rotational axis extending in the main extension plane of the casing.

7. The cushion-shaped concentrator according to claim 1, further comprising a fastening body arranged centrally in the interior of the casing,
wherein the tension elements are tensioned between the fastening body and the transparent membrane or between the fastening body and the reflector membrane.

8. The cushion-shaped concentrator according to claim 1, wherein a concavely curved section of the reflector membrane is formed by a pattern of the reflector membrane or by the overpressure of the gas in the interior of the casing such that the radiation reflected by the reflector membrane is concentrated in a linear area or in a point-shaped area at an absorber of the plurality of absorbers.

9. The cushion-shaped concentrator according to claim 1, wherein at least one absorber of the plurality of absorbers comprises at least one elongate line absorber,
wherein a respective concavely curved section of the reflector membrane is aligned towards the at least one elongate line absorber, and
wherein the respectively concavely curved section has a curvature that is substantially constant in the direction of longitudinal extension of the elongate line absorber.

10. The cushion-shaped concentrator according to claim 9, wherein the elongate line absorber is fastened at a longitudinal support connected with the transparent membrane.

11. The cushion-shaped concentrator according to claim 1, wherein an absorber of the plurality of absorbers comprises a plurality of small-area point absorbers arranged at a distance from each other, and
wherein a plurality of sections of the reflector membrane are concavely curved each as a spherical cap or a paraboloid and are assigned, respectively, to the plurality of small-area point absorbers.

12. The cushion-shaped concentrator according to claim 11, wherein the small-area point absorbers are, via a coupling rod or a rope, arranged immovable with respect to each other in their relative position, and
wherein the small-area point absorbers are displaced or swiveled synchronously with a drive device.

13. The cushion-shaped concentrator according to claim 1, wherein an absorber of the plurality of absorbers is mounted to allow displacement or swiveling of the absorber about at least one axis of rotation via at least one member selected from the group consisting of a self-locking reduction gear unit, a step motor, and a hydraulically or pneumatically operable linear drive.

14. The cushion-shaped concentrator according to claim 13, wherein the at least one member is configured to displace or swivel the absorber uniaxially along a path that is curved in the shape of a circular arc or biaxially in correspondence with a rotation body surface.

15. The cushion-shaped concentrator according to claim 1, further comprising a fastening body arranged in the interior of the casing and positioned stationary in the interior of the casing, and further comprising a swivelable connecting rod,
wherein an absorber of the plurality of absorbers is mounted to the fastening body via the swivelable connecting rod.

16. The cushion-shaped concentrator according to claim 1, wherein a tension element of the tension elements comprises at least one transparent film dividing the casing into at least two chambers.

17. The cushion-shaped concentrator according to claim 16, wherein the at least one transparent film comprises a first plurality of films arranged substantially parallel to each other and dividing the casing into elongate chambers.

18. A floating platform comprising:
a flat cover element,
a sealing element connected with the cover element, the sealing element being configured to make a sealing contact with a liquid surface and enclosing a closed cavity together with the flat cover element and the liquid surface or a bottom surface, and
an at pump producing an overpressure in the closed cavity, the overpressure supporting the platform,
wherein the flat cover element comprises at least one cushion-shaped concentrator for concentrating soar radiation in a plurality of absorbers, the cushion-shaped concentrator comprising:
the plurality of absorbers, wherein the plurality of absorbers comprises a plurality of photovoltaic elements or a plurality of tubes flown through by a medium,
a transparent membrane configured to face incoming solar radiation, wherein the plurality of absorbers is positioned adjacent to the transparent membrane,
a reflector membrane which reflects the incident radiation in the direction of the plurality of absorbers,
tension elements arranged between the transparent membrane and the reflector membrane, and
constrictions on the reflector membrane produced by the tension elements, respectively,
wherein the transparent membrane and the reflector membrane form an outer casing for a chamber filled with a gas at overpressure and the plurality of absorbers are arranged inside the chamber filled with the gas at overpressure,
wherein said tension elements counteract the overpressure in the chamber,
wherein said constrictions on the reflector membrane separate a plurality of distinct concavely curved sections of the reflector membrane from each other, and
wherein one of the plurality of absorbers is provided for each of the distinct concavely curved sections of the reflector membrane.

19. The floating platform according to claim 18, further comprising an elongate floating body connected to the flat cover element or to the sealing element,
wherein the elongate floating body is configured to project into the liquid, to float on the liquid surface, or to be disposed completely immersed in the liquid.

* * * * *

UNITED STATES PATENT AND TRADEMARK OFFICE
CERTIFICATE OF CORRECTION

PATENT NO.       : 9,447,989 B2
APPLICATION NO.  : 13/582556
DATED            : September 20, 2016
INVENTOR(S)      : Tiefenbacher et al.

Page 1 of 1

It is certified that error appears in the above-identified patent and that said Letters Patent is hereby corrected as shown below:

In The Claims
In particular, in Column 14, Line 21 (Line 8 of Claim 18) please change "an at pump" to correctly read: -- an air pump --.

Signed and Sealed this
Twenty-ninth Day of November, 2016

Michelle K. Lee
*Director of the United States Patent and Trademark Office*